United States Patent [19]
Harner et al.

[11] Patent Number: 5,161,980
[45] Date of Patent: Nov. 10, 1992

[54] ELECTRICAL INTERCONNECTION OF CIRCUIT DEVICES

[75] Inventors: Donald R. Harner, Camp Hill; James L. Schroeder, Palmyra, both of Pa.

[73] Assignee: AMP Incorporated, Harrisburg, Pa.

[21] Appl. No.: 756,414

[22] Filed: Sep. 9, 1991

[51] Int. Cl.⁵ .............................................. H01R 9/09
[52] U.S. Cl. .................................... 439/65; 361/385; 361/396; 439/74
[58] Field of Search ...................... 439/65, 66, 67, 68, 439/69, 70, 71, 74, 77, 928; 361/393–396, 385, 386, 398

[56] References Cited

U.S. PATENT DOCUMENTS

| | | |
|---|---|---|
| 4,134,631 | 1/1979 | Conrad et al. |
| 4,523,796 | 6/1985 | Rank ................................. 439/734 |
| 4,699,593 | 10/1987 | Grabbe et al. ..................... 439/71 |
| 4,850,883 | 7/1989 | Kabadi .............................. 439/591 |
| 4,873,613 | 10/1989 | Iversen ............................. 361/385 |
| 4,969,826 | 11/1990 | Grabbe ............................. 439/66 |
| 5,006,925 | 4/1991 | Bregman et al. .................. 361/381 |
| 5,007,841 | 4/1991 | Smolley ............................ 439/66 |
| 5,012,390 | 4/1991 | Erbele .............................. 361/407 |
| 5,033,970 | 7/1991 | Buchoff ............................ 439/591 |

FOREIGN PATENT DOCUMENTS 2-189992 7/1990 Japan ................................... 439/65

*Primary Examiner*—Neil Abrams
*Attorney, Agent, or Firm*—William B. Noll

[57] ABSTRACT

Apparatus 1 for interconnecting integrated circuit devices 2, extending in a row 16, column 17 and stack 19 with circuit boards 3 assembled to corresponding circuit devices 2, and jumper circuit boards 4 assembled to said circuit boards 3 with arrays of contacts 6, 7, and 15 interconnecting to the boards with the assembly forming a three-dimensional interconnection of devices.

8 Claims, 9 Drawing Sheets

ELECTRICAL INTERCONNECTION OF CIRCUIT DEVICES

FIELD OF THE INVENTION

The invention relates to interconnection of semiconductor circuit devices, and particularly to interconnection of circuit devices having computer processors.

BACKGROUND OF THE INVENTION

In the field of integrated circuits, small packages collectively known as integrated circuit devices contain large numbers of electrical circuits fabricated from semiconductors. These integrated circuit devices, have been constructed with external mounting features for mounting on a planar surface of a printed circuit board. Electrical circuit paths along layered surfaces of the circuit board electrically link together the integrated circuit packages.

In the construction of an electronic apparatus, for example, a computer, many such circuit boards, also called cards, plug edgewise into electrical connectors mounted on a back plane circuit board, for example, as described in U.S. Pat. No. 4,134,631. Many such cards are spaced apart from each other in a parallel array. This construction has been suitable for a computer that utilizes a single computer processor, particularly, a desktop computer. A computer with a single processor is able to perform a limited number of computer executions simultaneously, or in parallel. A larger computer utilizes multiple processors that are linked together, and that operate in concert, to perform massive numbers of parallel executions.

The multiple processors need to be linked together with a large number of electrical circuit paths, such that each processor will be linked to each of the others. Due to the processors being spaced apart from one another by relatively large distances, the electrical circuit paths, already large in number, must extend over such long distances to link each processor to each of the others. The circuit paths must be arranged along circuit routes that maintain desired electrical impedances, and that eliminate electrical influences that one circuit path induces upon another. It has been found that parallel cards, formerly used, have insufficient capacity for maintaining the number of electrical circuit paths and the specified electrical impedances for interconnecting multiple processors.

Computer processors are being designed with packages shaped as cubes, with each of the cubes being designed with multiple external surfaces and mounting features on the multiple external surfaces. Interconnection of the mounting features on the multiple surfaces is required.

SUMMARY OF THE INVENTION

The invention pertains to apparatus for interconnection of integrated circuit devices having multiple surfaces and mounting features on the multiple surfaces.

The circuit devices are arranged in horizontal columns and horizontal rows. Other circuit devices are stacked one on another in vertical stacks. The circuit devices of respective horizontal columns are arranged along horizontal circuit boards extending along sides of the columns. The circuit devices of respective horizontal rows are arranged along additional circuit boards extending horizontally over the rows. Respective circuit devices of each stack are arranged along further circuit boards extending vertically. In a resulting apparatus, three circuit boards overlap each circuit device, and the three circuit boards extend along a corresponding row, a corresponding column and a corresponding stack. Adjacent circuit boards arranged in the same plane are interconnected by jumper circuit boards that overlap and interconnect the adjacent circuit boards. The jumper boards contain the more densely arranged electrical circuit paths that interconnect each circuit device to distant circuit devices.

Accordingly, apparatus comprises, multiple circuit devices arranged in rows and in columns and in stacks, each of the multiple circuit devices having multiple surfaces and mounting features on the multiple surfaces, first circuit boards overlapping corresponding groups of the circuit devices arranged in at least one of said rows, second circuit boards overlapping groups of the circuit devices arranged in at least one of said columns, third circuit boards overlapping corresponding groups of the circuit devices arranged in at least one stack, interconnecting means interconnecting the mounting features of each circuit device with corresponding circuit boards that overlap such circuit device, a jumper board overlapping each pair of adjacent circuit boards, and further interconnecting means interconnecting circuit paths of said jumper board with additional circuit paths of the adjacent circuit boards.

The invention will now be described with reference by way of example to the detailed description and the accompanying drawings, according to which;

DETAILED DESCRIPTION

Figure 1:
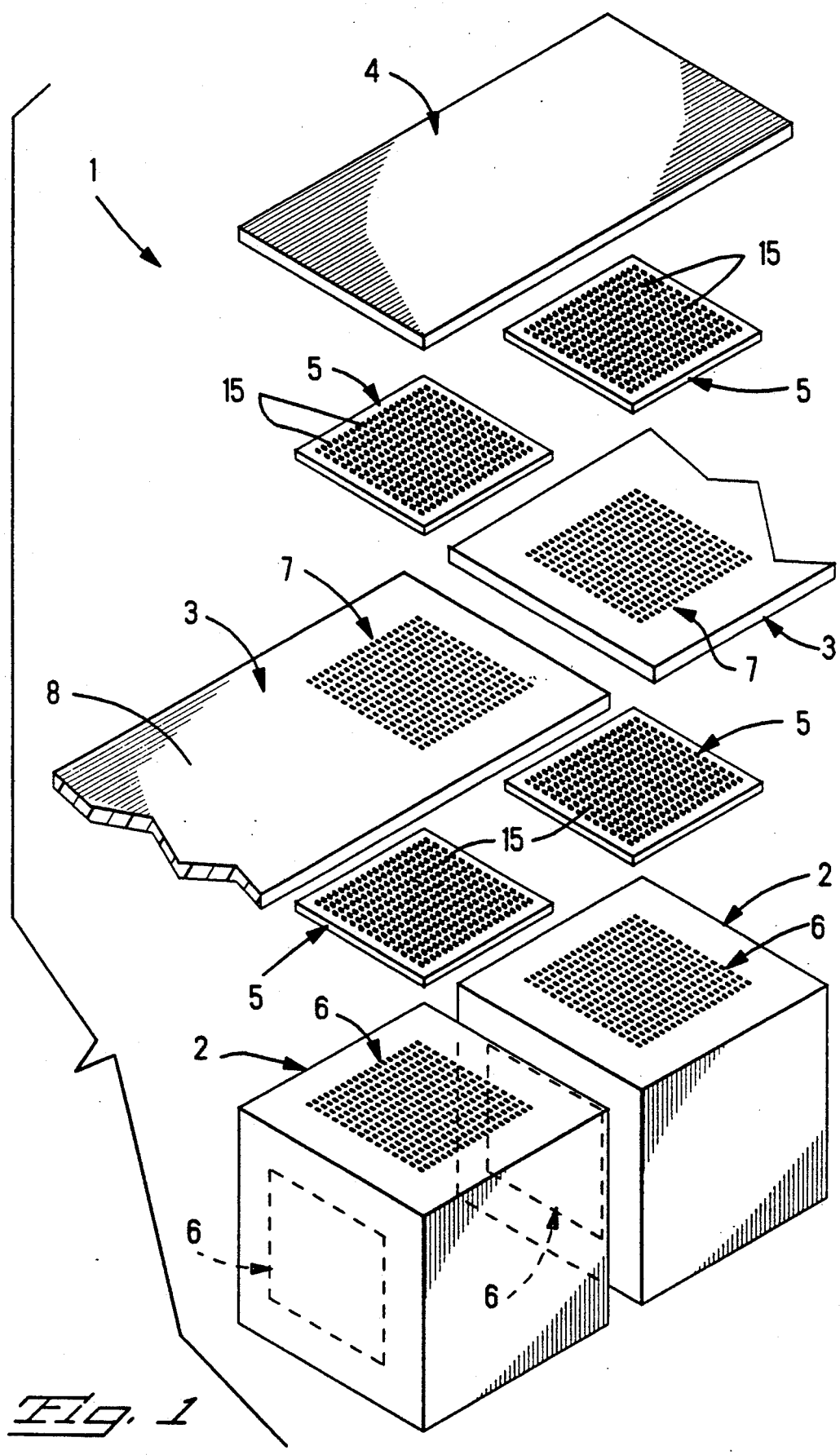
FIG. 1 is a fragmentary perspective view with parts exploded away from one another of two circuit devices and portions of apparatus for interconnection with the circuit devices.
Figure 2:
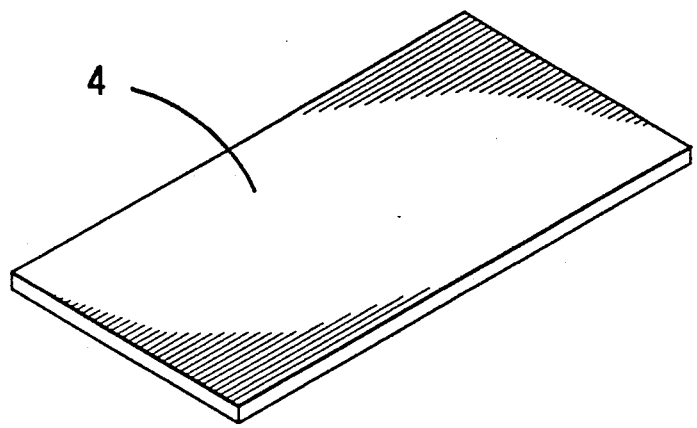
FIG. 2 is a perspective view of a jumper circuit board.
Figure 9:
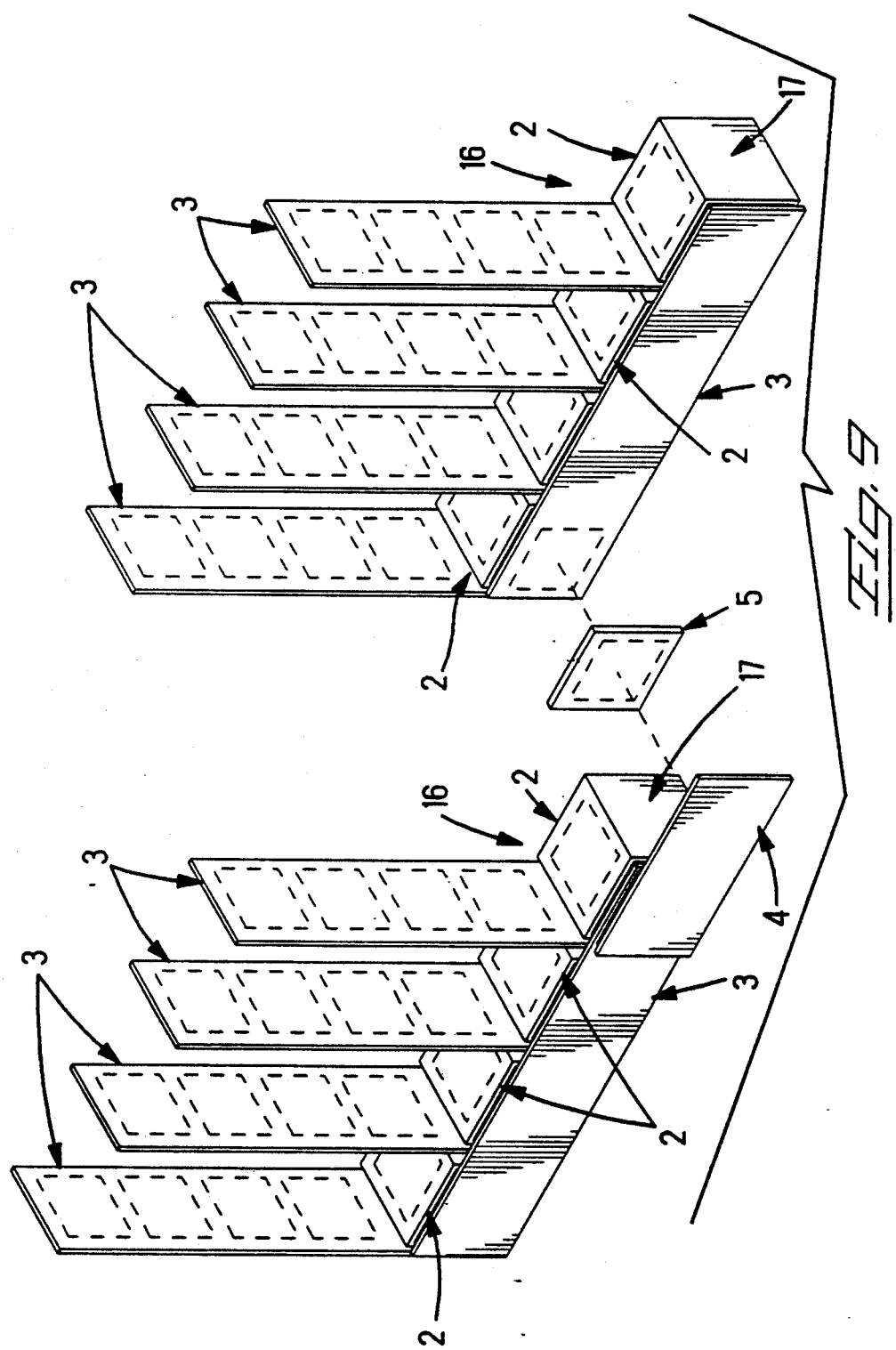

With reference to FIG. 1, apparatus 1 for interconnecting multiple integrated circuit devices 2, FIGS. 1 and 9, includes a circuit board 3, a jumper circuit board 4 and interconnecting means in the form of interposer connectors 5.

With reference to FIG. 1, each integrated circuit device 2 is in the shape of a cube having six surfaces and comprises a package containing integrated circuits of a computer processor of semiconductor construction. On three surfaces of the circuit device 2, densely grouped mounting features in the form of conductive pads 6 provide external electrical terminals for connecting with respective three circuit boards 3, FIG. 8.

Figure 4:
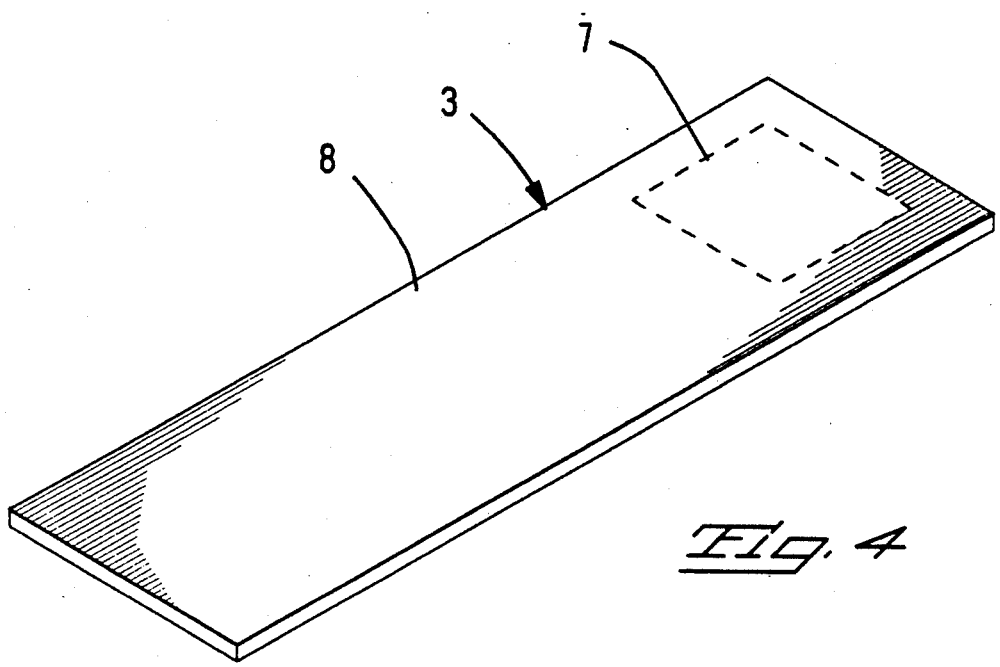
FIG. 4 is a perspective view of a circuit board.
Figure 5:
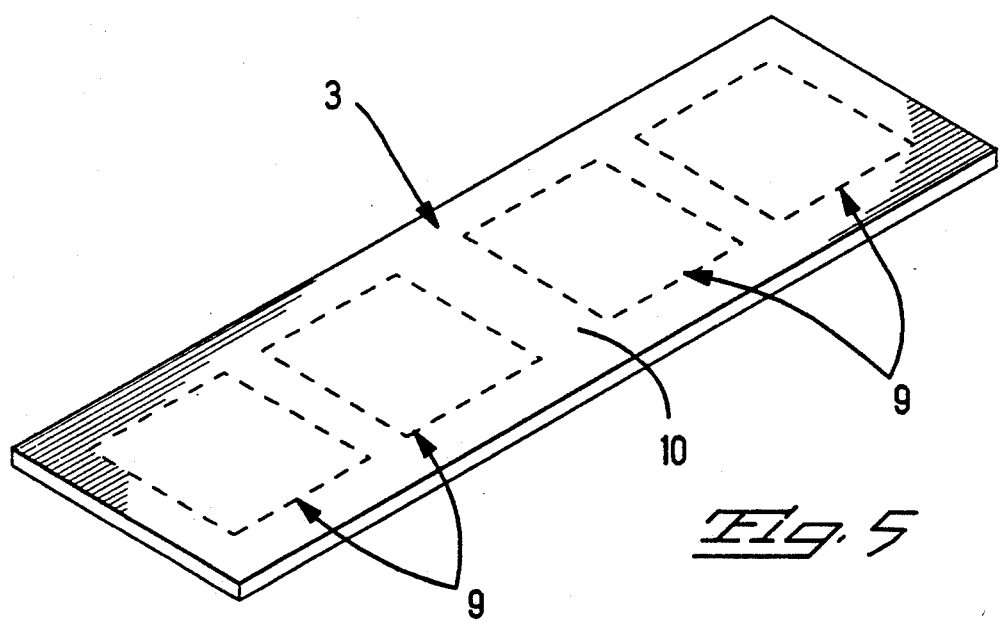
FIG. 5 is a perspective view of an under surface of the circuit board of FIG. 4.

Each circuit board 3 is of multilayer construction, in that it contains conductive paths, not shown, along various interior layers. A set of densely grouped, conductive pads 7, FIG. 4, are on an exterior surface 8 of the circuit board 3, near an end of the circuit board 3. Four sets of densely grouped conductive pads 9, FIG. 5, are on an opposite, exterior surface, illustrated as an under surface 10 of the circuit board 3. At least some of the pads 7 on the surface 8 are connected by conductive paths extending through the thickness of the circuit board 3 to pads 9 selected from the four sets on the under surface 10. The pads 9 in each of the four sets are aligned with the mounting features or pads 6 of one of a group of four circuit devices 2, FIG. 9, and are connected electrically thereto by an interposer connector 5. Thus, each circuit board 3 is provided with multiple sets of conductive pads 7 corresponding in number with the number of circuit devices 2 to be connected to the circuit board 3. The pads 7 on the surface 8 are connected with an additional interposer connector 5 to a jumper circuit board 4.

Figure 3:
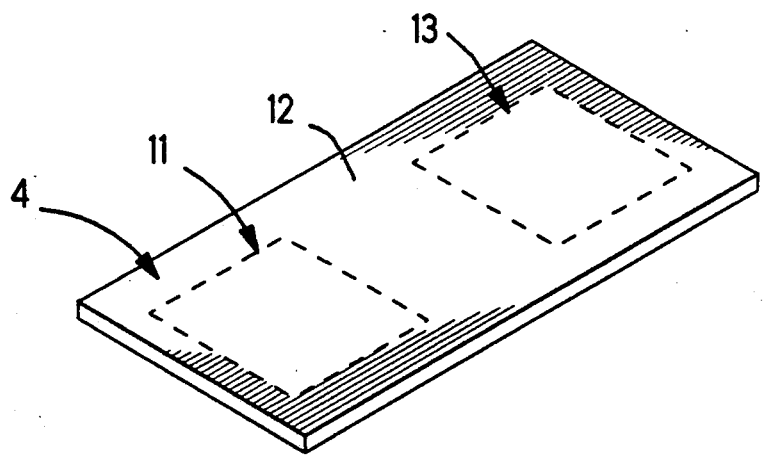
FIG. 3 is a perspective view of an under surface of the jumper circuit board of FIG. 2.

The jumper circuit board 4 is of multilayer construction, and has a first set of densely grouped, conductive pads 11, FIG. 3, on an under surface 12 of the jumper circuit board 4, that are aligned with corresponding pads 7 on the surface 8 of one of the circuit boards 3, and that are connected with such corresponding pads 7 by the additional interposer connector 5. The jumper circuit board 4 includes a second set of densely grouped conductor pads 13, FIG. 3, on the under surface 12 that are aligned with corresponding pads 7 on the surface 8 of another circuit board 3 for connection to another set of four circuit devices 2, FIG. 9.

Figure 6:
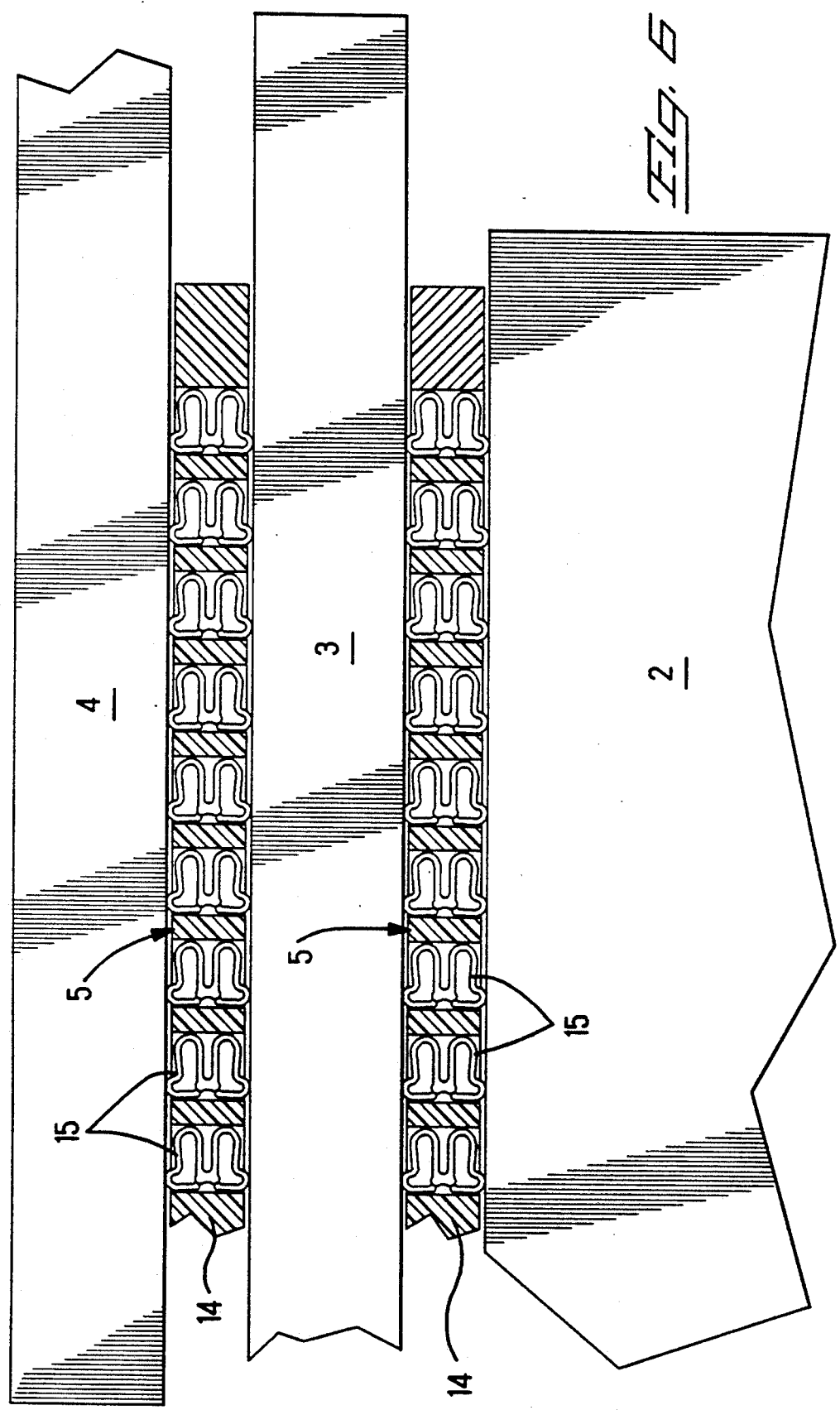
FIG. 6 is an enlarged, fragmentary elevation view illustrating construction of interposer connectors of the apparatus of FIG. 1.

Each interposer connector 5, FIGS. 1 and 6, includes a frame 14 and multiple electrical contacts 15. The contacts 15 of a corresponding interposer connector 5 are clamped between corresponding pads 6 on the circuit device and corresponding pads 9 on the under surface 10 of the circuit board 3. Thereby, the contacts 15 electrically connect corresponding mounting features or pads 6 of the circuit device 2 with corresponding pads 9 of the circuit board 3. The contacts 15 of the additional interposer connector 5 are clamped between corresponding pads 7 on the surface of the circuit board 8 and corresponding pads 11 on the under surface 12 of the jumper circuit board 4. Further details of construction of the interposer connector 5 are described in U.S. Pat. No. 4,699,593 and U.S. Pat. No. 4,969,826.

Construction and assembly of the apparatus 1 will now be described with reference to FIGS. 7 through 13. In these Figures, multiple circuit devices 2, circuit boards 3, jumper circuit boards 4 and interposer connectors 5 are illustrated with details of construction omitted. However, they are fabricated in accordance with the prior discussion referring to FIGS. 1 through 5.

Figure 7:
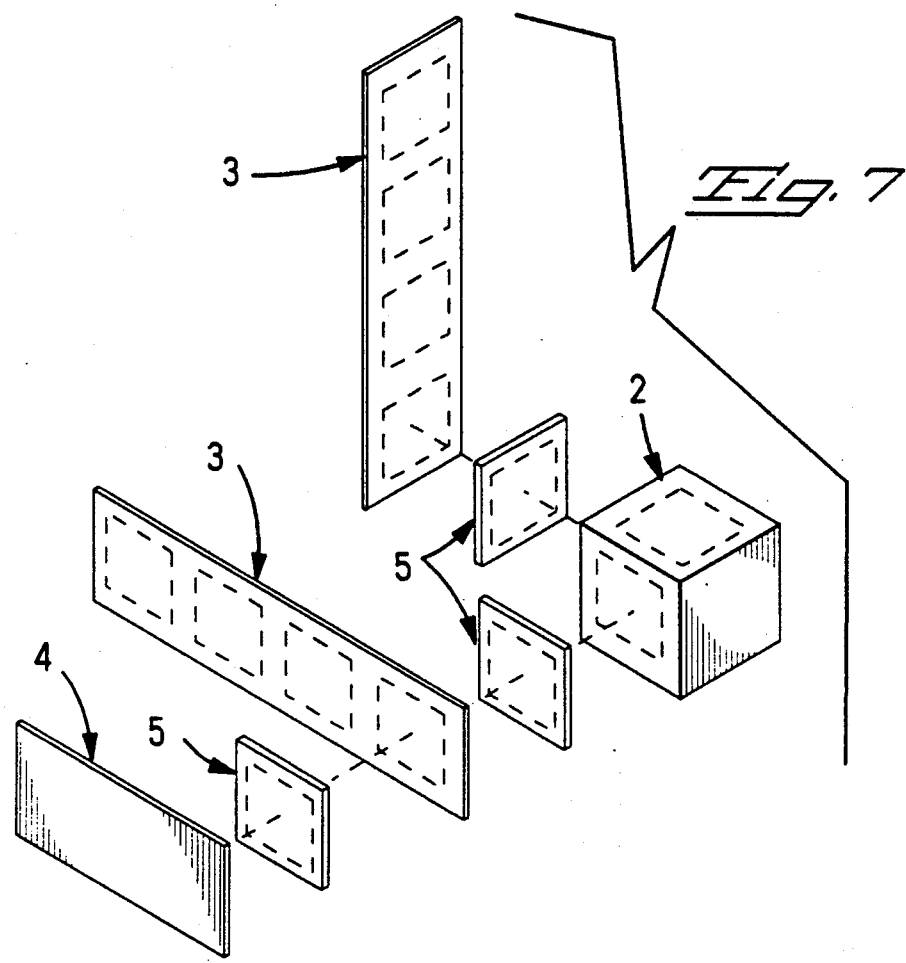
FIGS. 7-12 are perspective views illustrating apparatus interconnecting multiple circuit devices during different stages of construction, with FIG. 12 illustrating bus bars and coolant ducts.
Figure 8:
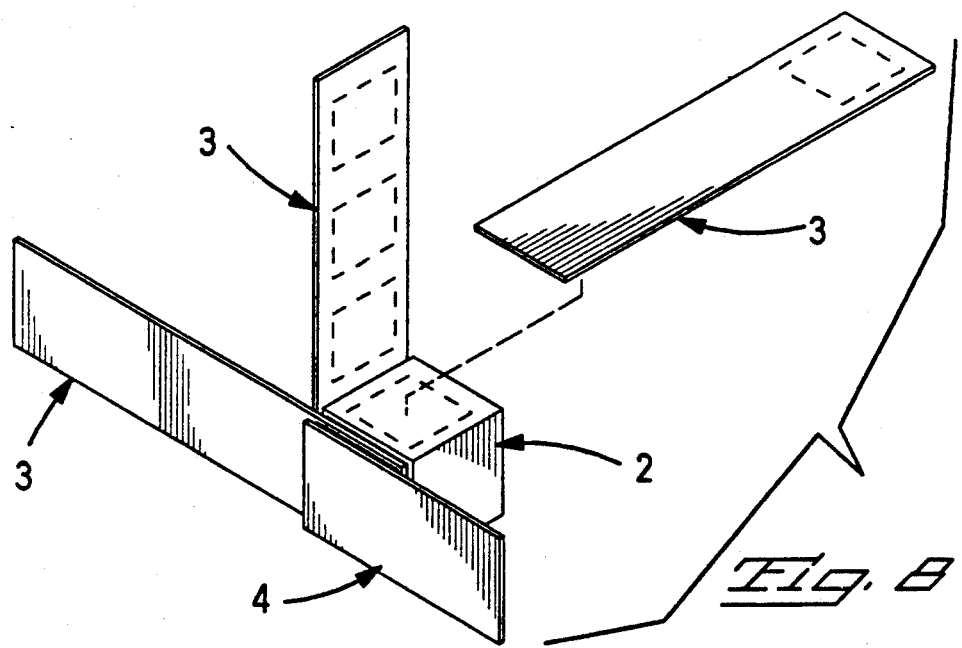

With reference to FIGS. 7 through 9, a first circuit device 2 is assembled to a horizontal edgewise, circuit board 3 and a vertical circuit board 3 together with corresponding interposer connectors 5, using common fasteners, not shown. With reference to FIG. 9, additional circuit devices 2 are assembled with corresponding vertical edgewise, circuit boards 3 and interposer connectors 5, and then are assembled with the horizontal circuit board 3 and corresponding interposer connectors 5. The horizontal circuit board 3 extends along and overlaps a set 16 of four circuit devices 2 arranged in a horizontal row 17. With reference to FIG. 9, a jumper circuit board 4 juts out horizontally from a corresponding circuit board 3.

Figure 10:
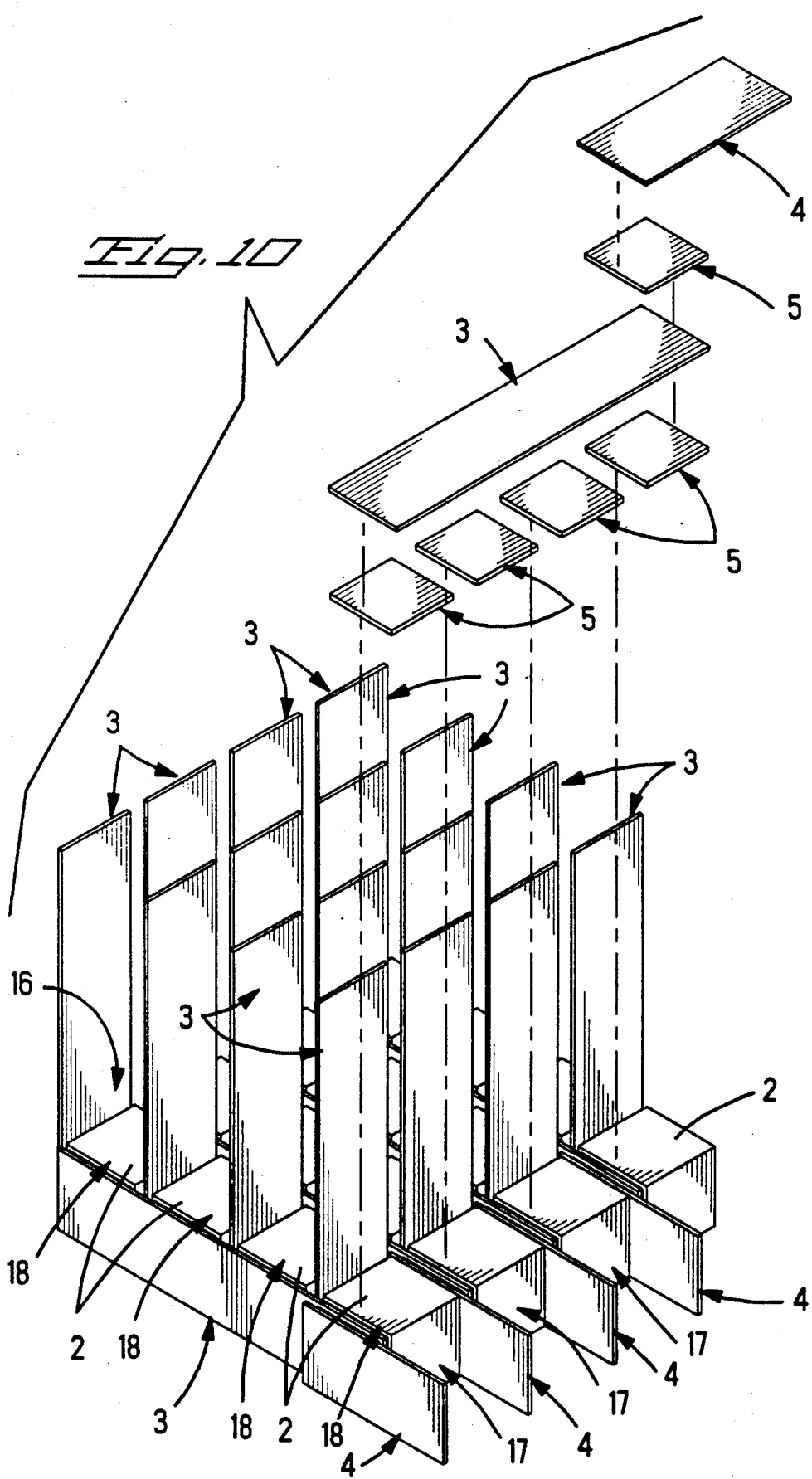
Figure 11:
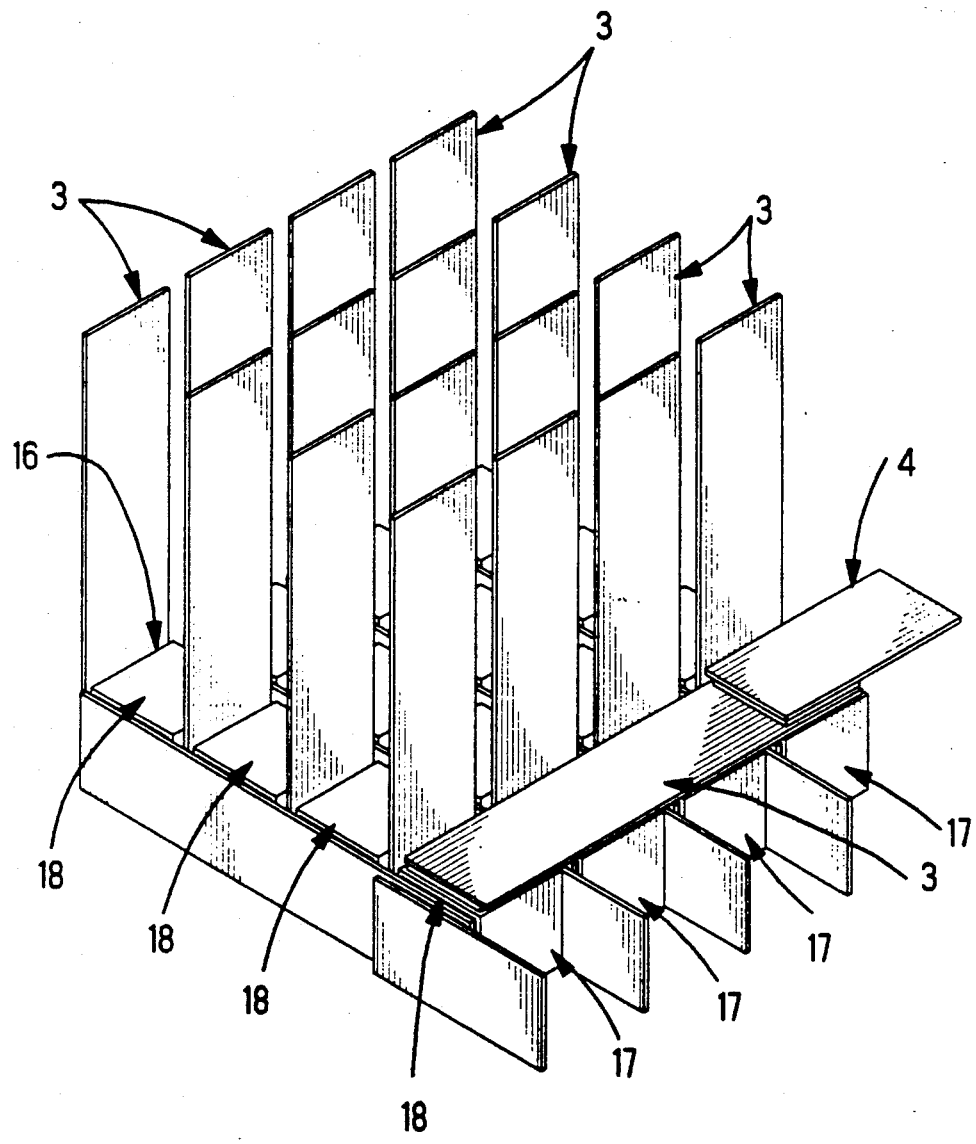

With reference to FIGS. 10 and 11, the assembly procedure, discussed with reference to FIGS. 7 through 9, is repeated to provide additional rows 17 of circuit devices 2 associated with the first row 17, such that multiple circuit devices 2, a set 16 of four in each row 17, are arranged in horizontal rows 17 and horizontal columns 18. The columns 18 each contain sets 16 of circuit devices 2. The horizontal circuit boards 3 connected to corresponding sets 16 of four circuit devices 2 extend along corresponding rows 17. The jumper circuit boards 4 jut horizontally outward from corresponding rows 17.

With reference to FIG. 9, an additional set 16 of four circuit devices can be added to extend a corresponding row 17. The jumper circuit board 4 is assembled with a corresponding interposer connector 5 to a circuit board 3 assembled to the additional set 16. Similarly, all the rows 17 of FIG. 10 can be extended by similar, additional sets 16 of circuit devices 2 and corresponding circuit boards 3 assembled to the jumper circuit boards 4.

The vertical circuit boards 3, FIGS. 10 and 11, extend outward vertically from the rows 17 and columns 18. Spaces are provided between the vertical circuit boards 3, for a horizontal circuit board 3, FIG. 10, and interposer connectors 5 to be laid over each one in a columnar set 16 of the circuit devices 2 extending in a corresponding column 18. The spaces permit access to the horizontal circuit board 3, such that common fasteners, not shown, can be applied to assemble the circuit board 3 and the interposer connectors 5 to each circuit device 2 in the column 18, FIG. 11.

The assembly procedure discussed in conjunction with FIGS. 10 and 11 is repeated to provide additional horizontal circuit boards 3, not shown, lying over corresponding columns 18 of circuit devices 2. Access to assemble the additional horizontal circuit boards 3 is provided by the spaces between the vertical circuit boards 3.

If additional sets 16 of circuit devices 2 are needed to extend the columns 18, jumper circuit boards 4 jut out horizontally from corresponding edgewise horizontal circuit boards 3. The jumper circuit boards 4 and interposer connectors 5 are assembled to corresponding horizontal circuit boards 3, using common fasteners, not shown. The columns 18 can be extended with additional sets 16 of four circuit devices 2, similar to the set 16 shown in FIG. 9, and corresponding circuit boards 3 assembled to the jumper circuit boards 4, and covering the circuit devices 2 in the columns 18. Each circuit device 2 in the rows 17 and columns 18 is assembled along three surfaces with three circuit boards 3, and is connected electrically to the three circuit boards 3 by corresponding interposer connectors 5.

Figure 12:
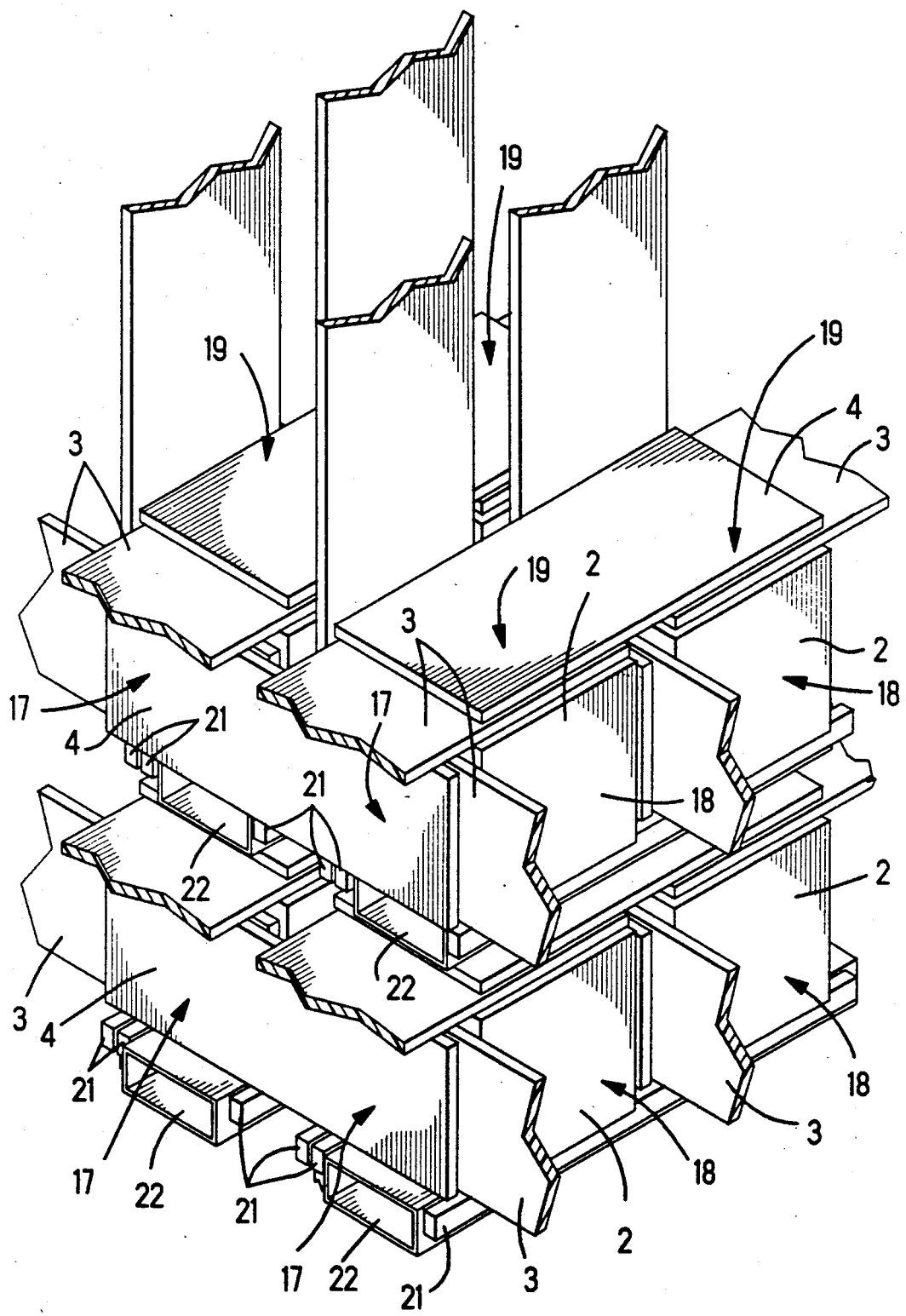

With reference to FIG. 12, elevated circuit devices 3 are in vertical stacks 19 over respective circuit devices 3 in the columns 17 and rows 18, and are assembled with corresponding additional interposer connectors 5 and with the vertical circuit boards 3. The elevated circuit devices 3 are shown as being arranged in corresponding elevated columns 18 and corresponding elevated rows 17, stacked over the circuit devices 3 in previously described columns 18 and rows 17. The elevated circuit devices 2 are assembled with horizontal circuit boards 3 extending along corresponding elevated rows 17, and with horizontal circuit boards 3 extending along corresponding elevated columns 18. Jumper circuit boards 5 can be added to extend the elevated rows 17 and columns 18. The elevated rows 17 and columns 18 can be extended by additional sets 16 of circuit devices 2, similar to the additional set 16 shown in FIG. 9, and corresponding circuit boards 3 assembled to the jumper circuit boards 4. Additional elevated rows 17 and columns 18 are constructed until the circuit devices 2 are arranged in a first group 20, shown partially completed, of N number of circuit devices 2 by N number of circuit devices 2, or N×N number of circuit devices. Each of the circuit devices 2 is in a corresponding row 17, a corresponding column 18 and a corresponding stack 19, of multiple circuit devices 2. Each of the circuit devices 2 is assembled on three surfaces with corresponding three circuit boards 3 that intersect each other without overlapping each other.

The four circuit devices 2 that are assembled with a corresponding circuit board 3 are electrically interconnected by the multiple circuit paths of the circuit board 3. The jumper circuit board 4 that is connected to the corresponding circuit board 3 carries densely grouped, internal circuit paths that interconnect each of the four circuit devices 2 of one set 16 with each circuit device 2 of another set 16 of four circuit devices 2, like the set 2 shown in FIG. 9, that extend the corresponding row 17, column 18 or stack 19.

Although FIG. 9 illustrates only one extended row 17 of circuit devices 2, such extended row 17 is contemplated to be included in a second group 20, shown partially completed in FIG. 9, constructed similarly as the first group 20, with N×N circuit devices 2 arranged in rows 17, columns 18 and stacks 19. Each row 17 of circuit devices 2 in the second group 20 is connected electrically by a corresponding jumper circuit board 4 to the circuit devices 2 in a corresponding row 17 of the first group 20.

In similar fashion, a third group, not shown, similar to the first group 20 of N×N circuit devices 2, can be connected electrically by the jumper circuit boards 4 of the first group 20 to the circuit devices 2 in corresponding columns 18 of the first group 20.

In similar fashion, a fourth group, not shown, similar to the first group 20 of N×N circuit devices 2, can be connected electrically by the jumper circuit boards 4 to the circuit devices 2 in corresponding stacks 19 of the first group 20. Additional groups, not shown, similar to the first group 20, can be connected electrically with jumper circuit boards, similar to the jumper circuit boards 4 of the first group 20, of the second, third and fourth groups, until the circuit paths in the jumper circuit boards become too densely grouped, whereby signal coupling occurs between adjacent circuit paths. An explanation of signal coupling appears in U.S. Pat. No. 4,846,727.

Because circuit paths are required to connect each circuit device 2 of one set 16 with each other circuit device 2 of an additional set 16 through a jumper circuit board 4, such circuit paths become densely grouped. The routing of the circuit paths becomes more difficult as they become more densely grouped. In the apparatus 1 described, the most densely grouped circuit paths are advantageously confined to the jumper circuit boards 4. The jumper circuit boards 4 have only two sets of pads 11, FIG. 3, whereas the circuit boards 3 are more complex in design, only to the extent that they have four sets of pads 9, FIG. 5. However, the circuit boards 3 are free of the most densely grouped circuit paths that are confined to the jumper boards 4. Thereby, the over all complexity of the circuit boards 3 is reduced.

With reference to FIG. 12, elongated bus bars 21 extend along each of the columns 18 for connection to the circuit devices 2 in the columns 18. For example, the bus bars 21 connect electrical power to the circuit devices 2 or connect reference electrical potential including ground, to the circuit devices 2. Elongated coolant transmitting tubes 22 extend along each of the columns 18 for transmitting coolant along each of the circuit devices 2.

We claim:

1. Apparatus for electrical interconnection of circuit devices comprising:

multiple circuit devices each having an area array of contacts on at least three surfaces of the device with groups of devices arranged in rows and columns and stacks, first circuit boards overlapping a group of the circuit devices arranged in at least one of said rows, second circuit boards overlapping a group of circuit devices arranged in at least one of said columns, third circuit boards overlapping a group of the circuit devices arranged in at least one stack, the circuit boards each having conductive paths connected to surface contacts corresponding to the area array of contacts on the devices, interconnecting means interconnecting the contacts of each circuit device with the contacts of a corresponding circuit board that overlaps such device, a jumper circuit board having conductive paths connected to surface contacts in turn connected to the area array contacts of a given circuit board and overlapping the ends of circuit boards in a given row, column, or stack, and further interconnecting means interconnecting the contacts of the said jumper board with the contacts of the circuit boards in a given row, column, or stack.

2. Apparatus as recited in claim 1 further comprising:

the first said circuit boards being in a first plane, the said second said circuit boards being in a second plane different from the first plane, and the third circuit boards being in a third plane different from the first and second planes.

3. Apparatus as recited in claim 2 wherein said planes intersect one another.

4. Apparatus as recited in claim 1 and further comprising:

coolant transporting conduits extending along corresponding groups of circuit devices arranged in said columns and extending between adjacent circuit devices in each of said column or stacks.

5. Apparatus as recited in claim 1 and further comprising:

coolant transporting conduits along said group of the multiple circuit devices arranged in at least one column.

6. Apparatus as recited in claim 5 and further comprising:

conductive bus bars extending along said conduits.

7. Apparatus as recited in claim 1 and further comprising:

conductive bus bars extending along said group of circuit devices arranged in at least one column.

8. Apparatus for interconnection of circuit devices having multiple surfaces and mounting features on the multiple surfaces, the apparatus comprising:

multiple circuit devices arranged in multiple rows and in multiple columns and in columnar stacks such that each of the circuit devices is positioned in a corresponding row and in a corresponding column and in a corresponding columnar stack, each of the multiple circuit devices having multiple surfaces and arrays of contacts on each surface, multiple first circuit boards serially arranged adjacent one another, each of the first circuit boards overlapping a corresponding group of the multiple circuit devices arranged in at least one of said rows, multiple second circuit boards serially arranged adjacent one another, each of the second circuit boards overlapping a corresponding group of the multiple circuit devices arranged in a corresponding columnar stack, multiple third circuit boards serially arranged and adjacent one another, each of the third circuit boards overlapping a corresponding group of the multiple circuit devices arranged in at least one of said columns, interconnecting means interconnecting the contacts of each of the multiple circuit devices with a corresponding circuit board that overlaps such circuit device and includes a corresponding array of contacts, multiple jumper boards overlapping portions of the adjacent circuit boards and including contacts corresponding to the contacts of the circuit boards, and further interconnecting means interconnecting the contacts of the circuit devices to the contacts of the jumper boards with additional circuits overlapping portions of the adjacent circuit boards.

* * * * *